(12) United States Patent
Bang et al.

(10) Patent No.: US 6,235,120 B1
(45) Date of Patent: May 22, 2001

(54) COATING FOR PARTS USED IN SEMICONDUCTOR PROCESSING CHAMBERS

(75) Inventors: Won Bang, San Jose; Chen-An Chen, Sunnyvale, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/105,970

(22) Filed: Jun. 26, 1998

(51) Int. Cl.[7] .............................. C23D 5/00; C23C 16/00
(52) U.S. Cl. ........................ 118/725; 156/345; 427/402
(58) Field of Search .................. 118/715, 45, 725; 204/298.11, 298.15; 428/628; 427/402; 156/345

(56) References Cited

U.S. PATENT DOCUMENTS

| | | | |
|---|---|---|---|
| 4,294,193 | * 10/1981 | Gordon | 118/718 |
| 4,880,717 | * 11/1989 | Kitagawa et al. | 430/58 |
| 4,904,542 | 2/1990 | Mroczkowski . | |
| 5,001,019 | * 3/1991 | Ito et al. | 428/621 |
| 5,135,629 | 8/1992 | Sawada et al. . | |
| 5,171,645 | * 12/1992 | Khandkar | 429/33 |
| 5,350,720 | 9/1994 | Kawada et al. . | |
| 5,482,612 | 1/1996 | Armstrong et al. . | |

FOREIGN PATENT DOCUMENTS 0 401 035 A2  12/1990  (EP) .

* cited by examiner

Primary Examiner—Gregory Mills
Assistant Examiner—Alva C Powell
(74) Attorney, Agent, or Firm—Dugan & Dugan

(57) ABSTRACT

Improved semiconductor processing chamber parts are provided. An improved part is made of an underlying part having both an intermediate coating and a surface layer applied thereto. The intermediate coating includes a plurality of layers each having a CTE intermediate the CTE of the underlying part and the CTE of the surface layer. The intermediate coating reduces the stress between any two layers, allowing use of underlying parts and surface layers having dissimilar CTEs. The universe of acceptable materials for use within a semiconductor processing chamber is expanded, as fewer selection criteria exist for a given layer.

8 Claims, 2 Drawing Sheets

COATING FOR PARTS USED IN SEMICONDUCTOR PROCESSING CHAMBERS

FIELD OF THE INVENTION

The present invention relates to an improved coating for parts used within semiconductor processing chambers, and more specifically to an intermediate coating that effectively adheres to both an underlying part and to a surface layer, despite differing thermal expansion rates between the part and the surface layer.

BACKGROUND OF THE INVENTION

During fabrication, a semiconductor device undergoes a variety of processing steps such as physical vapor deposition, chemical vapor deposition, etching and the like. Many of these processes, particularly etching, are performed within corrosive processing chamber environments (e.g., $NF_3$, F, and/or $O_3$ at elevated temperatures). These corrosive environments may attack and corrode the various parts within the processing chamber, such as heaters, electrical coils, chamber walls, clamp rings, collimators, shields, etc. Therefore, processing chamber parts must be resistant to corrosive processing environments, so as not to degrade and possibly contaminate a semiconductor device being processed within the chamber.

Further, a number of corrosive fabrication processes involve the deposition of material layers on a semiconductor substrate. As material is deposited on a semiconductor substrate, it also deposits on processing chamber parts, and in turn may flake therefrom, contaminating semiconductor substrates processed therewithin. To prevent such contamination, chamber parts are periodically etched to remove deposited material. Thus, many processing chamber parts must be resistant to the deposited material's etchant, such that selective etching may occur.

Accordingly, when constructing a part for use within a semiconductor processing chamber, the selection of materials that exhibit not only favorable surface characteristics (e.g., corrosion resistance, or desired etch properties), but also exhibit favorable bulk characteristics (e.g., inexpensive, easily manufactured, good thermal conductivity, desirable magnetic properties, strength, etc.) presents a significant challenge. To broaden the universe of materials that may be used for processing chamber parts, coated parts are often employed wherein an underlying part is formed of a material that exhibits desired bulk characteristics, and a material that exhibits desired surface characteristics is applied thereto. While such coated parts somewhat ease the material selection process, coated parts can present a significant source of contamination when processing at elevated temperatures. Specifically, as the processing chamber thermally cycles (e.g., between various processing, cleaning or maintenance steps) so do the processing chamber's coated parts. If an underlying part and its coating differ in thermal coefficient of expansion, during thermal cycling the underlying part and the coating will expand and contract at different rates, resulting in stress therebetween (i.e., thermal stress). Such thermal stress can cause the coating material to flake from the underlying part, leaving the underlying part exposed to corrosive processing gases, and, moreover, introducing potential contaminants to the processing atmosphere. Thus, because of the need to match thermal coefficients of expansion, the practice of coating parts introduces additional constraints to the material selection process.

A need therefore exists for processing chamber parts which satisfy both the bulk characteristics and the surface characteristics required for a given processing environment, without introducing undesirable particles thereto.

SUMMARY OF THE INVENTION

The present invention significantly expands the universe of acceptable materials for semiconductor processing chamber parts by providing an intermediate coating between the underlying part and the surface layer. Specifically, the intermediate coating of the present invention comprises a plurality of material layers each having a coefficient of thermal expansion (CTE) between that of the underlying part, and that of the surface layer. The part's overall CTE therefore gradually transitions from the CTE of the underlying part to the CTE of the surface layer, reducing thermally induced stress and contamination associated therewith. Each layer within the intermediate coating may reduce thermal stress by the same amount, or by a varying amount.

The inventive intermediate coating enables an underlying part having both favorable bulk characteristics (e.g., inexpensive, easily manufactured, high thermal conductivity) and unfavorable surface characteristics (e.g., poor etch properties, unsuitable corrosion resistance) to be employed within a corrosive fabrication process, and broadens the universe of acceptable surface layers that effectively adhere to the underlying part. The inventive intermediate coating particularly benefits heaters exposed to corrosive environments, and process kit parts exposed to deposition material etchants during cleaning. However, the inventive intermediate coating may be advantageously applied to any part that undergoes thermal cycling.

Other objects, features and advantages of the present invention will become more fully apparent from the following detailed description of the preferred embodiments, the appended claims and the accompanying drawings.

DETAILED DESCRIPTION OF THE PREFERRED EMBODIMENTS

Figure 1:
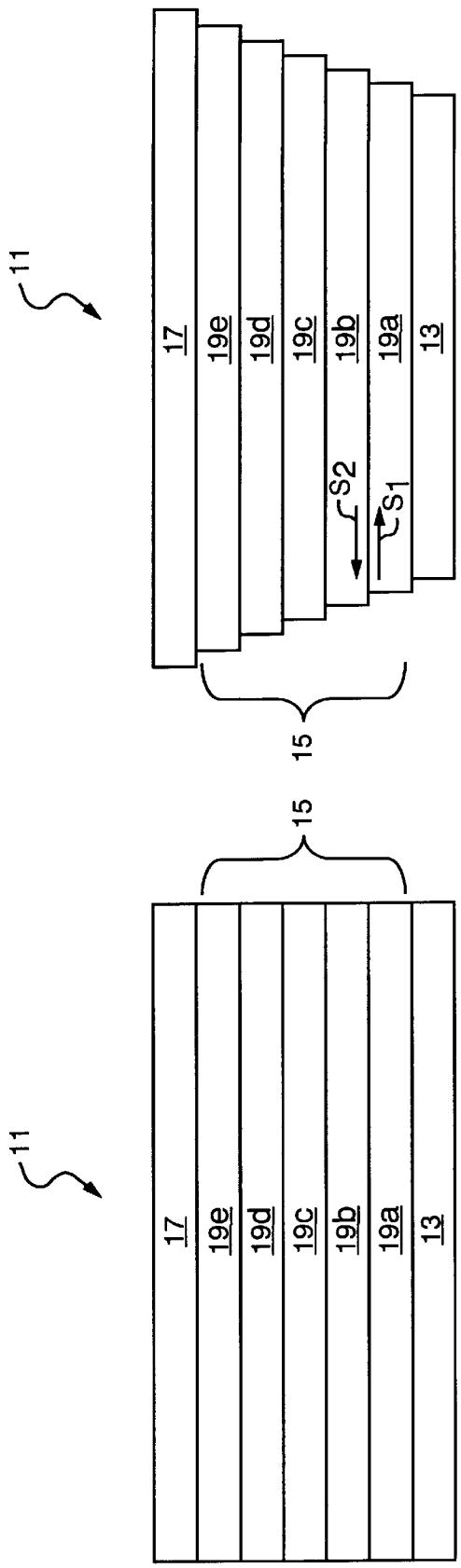
FIGS. 1A and 1B are side elevational views of a semiconductor processing chamber part configured in accordance with the present invention, generally represented at an ambient temperature and at an elevated temperature, respectively.

FIG. 1A is a side elevational view, generally representing a processing chamber part 11, configured in accordance with the present invention. The processing chamber part 11 comprises an underlying part 13 having a first CTE, an intermediate coating 15 having an intermediate CTE, and a surface layer 17 having a second CTE. The underlying part 13 exhibits one or more bulk characteristics which are favorable, and one or more surface characteristics which are unfavorable, and the surface layer 17 exhibits at least one surface characteristic which is favorable, and which is unfavorably possessed by the underlying layer 13 (e.g., the underlying part 13 is corrosive in the processing environment and the surface layer 17 is not corrosive in the processing environment). The intermediate coating 15 is comprised of a plurality of intermediate layers 19a–e, as shown in FIG. 1A, each of which has an intermediate CTE. As used herein, an intermediate CTE refers to a CTE value that falls within the range between the CTE value of the underlying part 13 and the CTE value of the surface layer 17.

Preferably the CTE of each intermediate layer 19a–e falls within the range defined by the CTE of the layers on either side thereof. The overall CTE of the processing chamber part 11, therefore gradually transitions between the first CTE and the second CTE, reducing the thermal stress that exists between any two adjacent layers, and reducing thermal stress induced particle generation.

Preferably, each layer within the intermediate coating 15 exhibits a thermal stress of $(1/n)(x)$, where n is the number of intermediate layers and x is the thermal stress that would occur if the underlying part 13 and the surface layer 17 were in direct contact, with no intermediate coating 15 therebetween.

FIG. 1B is a side elevational view representing the part of FIG. 1A at an elevated temperature. FIG. 1B is useful for understanding how the inventive processing chamber part 11 reduces the selection criteria for each material layer.

For example, assume the underlying part 13 has a CTE of $7 \times 10^{-6/c}$, and the surface layer 17 has a CTE of $1 \times 10^{-6/c}$. The difference in CTE, in this example $6 \times 10^{-6/c}$, is proportional to the overall thermal stress that would exist between the underlying part 13 and the surface layer 17 if no intermediate coating 15 existed therebetween. Preferably, to gradually reduce the overall thermal stress, each intermediate layer 19a–e reduces the overall thermal stress by an equivalent amount, in this example by an amount proportional to $1 \times 10^{-6/c}$. To achieve equal thermal stress reduction, intermediate layer 19a has a CTE of $6 \times 10^{-6/c}$, intermediate layer 19b has a CTE of $5 \times 10^{-6/c}$, intermediate layer 19c has a CTE of $4 \times 10^{-6/c}$, intermediate layer 19d has a CTE of $3 \times 10^{-6/c}$ and intermediate layer 19e has a CTE of $2 \times 10^{-6/c}$. Accordingly, during thermal cycling, stress between any two adjacent layers is proportional to $1 \times 10^{-6/c}$, 1/6 the stress that would exist in the absence of the intermediate coating 15.

It will be understood the CTE values provided above are merely exemplary; materials with these exact CTE values may not exist. Similarly, any materials may be employed that have CTE values that result in an acceptable thermal stress value between adjacent layers; the differences in CTE values of adjacent layers provide above are merely exemplary.

As the processing chamber part 11 thermally cycles the part's various layers expand and contract between the positions represented in FIGS. 1A and 1B. At elevated temperatures the expansion of each layer increases from the underlying part 13 to the surface layer 17, as shown in FIG. 1B. Thus, thermal stress (represented in FIG. 1B by opposing arrows S1 and S2) between adjacent layers, and the particles generated thereby, is significantly reduced with use of the present invention.

Moreover, material selection is facilitated, as both the materials of the underlying part, and of the surface layer may be selected for their respective bulk, and surface characteristics, without regard for CTE matching. Thus, the present invention greatly increases the universe of acceptable materials for underlying parts and for surface layers, allowing semiconductor processing chamber parts to be easily tailored to meet the requirements of a given process. Similarly, with use of the present invention, materials for the intermediate layers 19a–e may be freely selected without regard for surface characteristics—the primary consideration for selection of an intermediate layer 19a–e being the desired CTE.

The processing chamber part 11 represents any number of processing chamber parts (e.g., process kit parts, heaters, chamber walls). For example, the underlying part 13 may be a heating layer (e.g., comprising aluminum or aluminum nitride), and the surface layer 17 may be magnesium fluoride, iridium, aluminum trifluoride, etc., each of which exhibits a favorable surface characteristic when employed as a heater coating within a semiconductor device processing chamber. It will be understood that in most instances, the thickness of the intermediate coating, and preferably the thickness of each of the intermediate layers therein, is minimal (i.e., only as thick as is needed to effectively reduce thermal stress). Intermediate coatings of minimal thickness reduce attenuation of the underlying part's favorable characteristics (e.g., heat transfer) and reduce material costs. The intermediate layers 19a–e may be formed by conventional methods (e.g., chemical vapor deposition, physical vapor deposition, plasma spray, diffusion bonding) as will be apparent to those of ordinary skill in the art.

Figure 2:
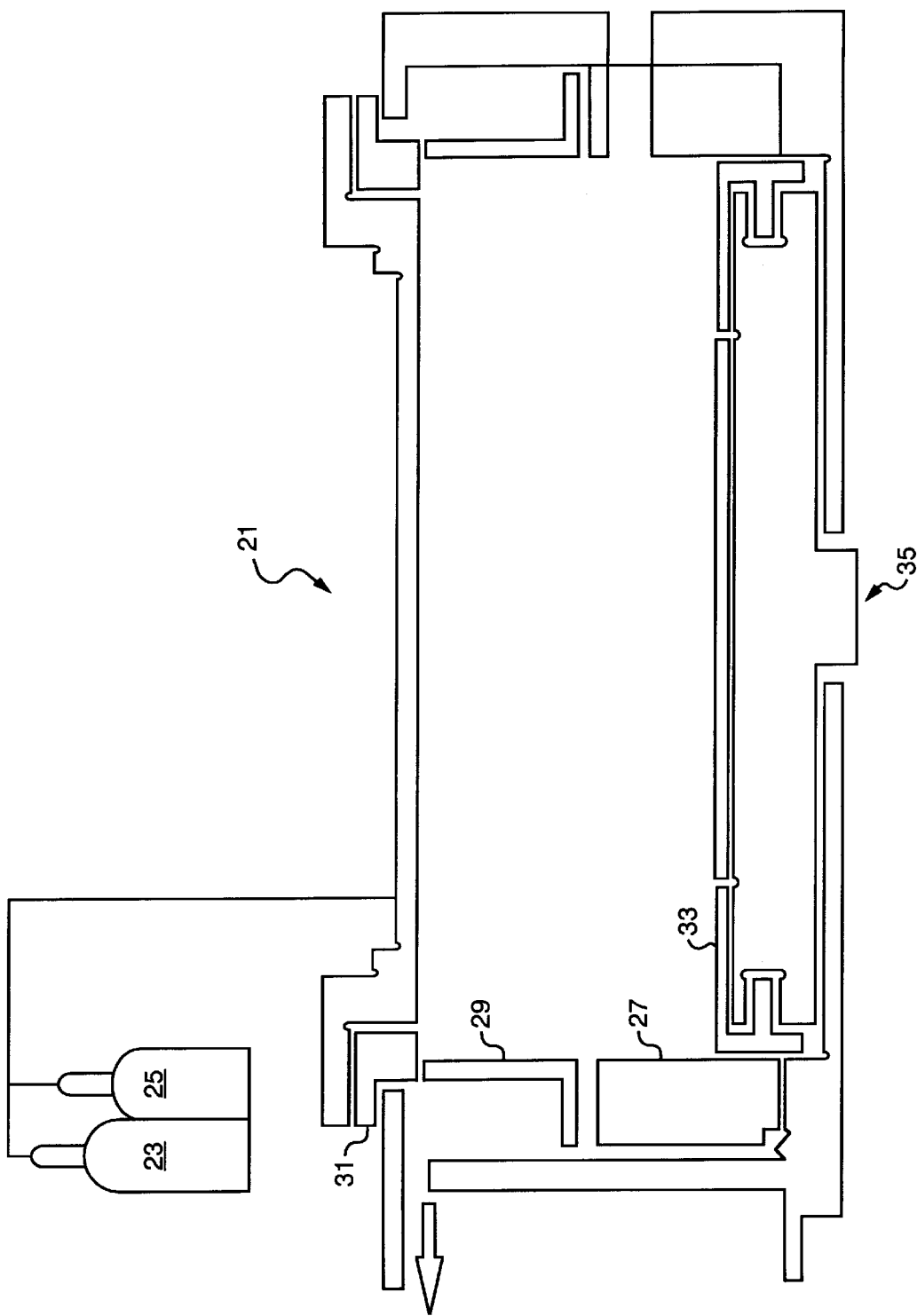
FIG. 2 is a diagrammatic side elevational view, in pertinent part, of a semiconductor processing chamber containing the coated semiconductor processing chamber part of FIGS. 1A and 1B.

FIG. 2 is a diagrammatic side elevational view of a processing chamber 21 used for chemical vapor deposition. The processing chamber 21 is operatively coupled to a source of a first gas 23, and to a source of a second gas 25. The processing chamber 21 contains a number of exemplary parts which may benefit from the present invention, such as a chamber liner 27, an L-insert 29, an isolator 31, a clamp ring 33, and a heater 35. Other types of processing chambers, such as physical vapor deposition, chemical etch or degassing chambers may contain a number of parts which also benefit from the present invention (e.g., RF coils, collimators, gas distribution plates, shields, or shutters).

The foregoing description discloses only the preferred embodiments of the invention, modifications of the above disclosed apparatus and method which fall within the scope of the invention will be readily apparent to those of ordinary skill in the art. For instance, while the intermediate layers nearest the underlying part and/or nearest the surface layer may contain the underlying or surface material, other intermediate layers may not include the underlying and/or surface materials (i.e., may be exclusive of the underlying and/or surface materials). In fact, all of the intermediate layers may be exclusive of the underlying material and/or the surface material. Further, intermediate layers may be graded (i.e., have compositions which gradually transition from one material to the next) to further facilitate gradual transitioning of CTE. Accordingly, while the present invention has been disclosed in connection with the preferred embodiments thereof, it should be understood that other embodiments may fall within the spirit and scope of the invention, as defined by the following claims.

The invention claimed is:

1. A semiconductor processing chamber for processing wafers at elevated temperatures comprising:
   a chamber enclosure;
   a material source operatively coupled to the chamber enclosure for forming a material layer on a semiconductor wafer processed within the chamber;
   a source of processing gas operatively coupled to the chamber enclosure for supplying a processing gas thereto; and
   a part contained within the chamber enclosure, the part having:
      an underlying part of a first material having a first coefficient of thermal expansion;
      an intermediate coating on the underlying part comprising a plurality of intermediate layers each intermediate layer having an intermediate coefficient of thermal expansion; and a surface layer on the intermediate coating, of a second material having a second coefficient of thermal expansion;

wherein the intermediate coefficient of thermal expansion of each intermediate layer is between the first coefficient of thermal expansion and the second coefficient of thermal expansion, the surface layer is corrosion resistant to the processing gas; and a plurality of the intermediate layers are exclusive of both the first material and the second material.

2. The apparatus of claim 1 wherein the surface layer and the material source comprise different materials.

3. A semiconductor processing chamber for processing wafers at elevated temperatures, comprising:

a chamber enclosure;

a material source operatively coupled to the chamber enclosure for forming a material layer on a semiconductor wafer processed within the chamber enclosure;

a source of processing gas operatively coupled to the chamber enclosure for supplying a processing gas thereto; and a part contained within the chamber enclosure, the part having:

an underlying part of a first material having a first coefficient of thermal expansion;

an intermediate coating on the underlying part comprising a plurality of intermediate layers, each intermediate layer having an intermediate coefficient of thermal expansion; and a surface layer on the intermediate coating, of a second material having a second coefficient of thermal expansion;

wherein the intermediate coefficient of thermal expansion of each intermediate layer is between the first coefficient of thermal expansion and the second coefficient of thermal expansion, the surface layer is resistant to an etchant of the material layer, and a plurality of the intermediate layers are exclusive of both the first material and the second material.

4. The apparatus of claim 3 wherein the surface layer and the material source comprise different materials.

5. A semiconductor processing chamber comprising:

a chamber enclosure;

a material source operatively coupled to the chamber enclosure for forming a material layer on a semiconductor wafer processed within the chamber enclosure;

a source of processing gas operatively coupled to the chamber enclosure; and a heater contained within the chamber enclosure, the heater having:

a heating layer having a first coefficient of thermal expansion;

an intermediate coating on the heating layer, comprising a plurality of intermediate layers, each intermediate layer having an intermediate coefficient of thermal expansion; and a surface layer on the intermediate coating, having a second coefficient of thermal expansion;

wherein the intermediate coefficient of thermal expansion of each intermediate layer is between the first coefficient of thermal expansion and the second coefficient of thermal expansion, the surface layer is resistant to corrosion by the processing gas and a plurality of the intermediate layers are exclusive of both the first material and the second material.

6. The apparatus of claim 5 wherein the surface layer and the material source comprise different materials.

7. A semiconductor processing chamber comprising:

a chamber enclosure;

a material source operatively coupled to the chamber enclosure for forming a material layer on a semiconductor wafer processed within the chamber enclosure;

a source of processing gas operatively coupled to the chamber enclosure; and a heater contained within the chamber enclosure, the heater having:

a heating layer having a first coefficient of thermal expansion;

an intermediate coating on the heating layer, comprising a plurality of intermediate layers, each intermediate layer having an intermediate coefficient of thermal expansion; and a surface layer on the intermediate coating, having a second coefficient of thermal expansion;

wherein the intermediate coefficient of thermal expansion of each intermediate layer is between the first coefficient of thermal expansion and the second coefficient of thermal expansion; and the plurality of intermediate layers gradually transition between the first coefficient of thermal expansion and the second coefficient of thermal expansion; and the surface layer is resistant to corrosion by the processing gas and a plurality of the intermediate layers are exclusive of both the first material and the second material.

8. The apparatus of claim 7 wherein the surface layer and the material source comprise different materials.

* * * * *